(12) United States Patent
Takeuchi et al.

(10) Patent No.: US 6,998,763 B2
(45) Date of Patent: Feb. 14, 2006

(54) CERAMIC DEVICE

(75) Inventors: Yukihisa Takeuchi, Nagoya (JP); Tsutomu Nanataki, Nagoya (JP); Koji Kimura, Nagoya (JP); Masao Takahashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/230,731

(22) Filed: Aug. 29, 2002

(65) Prior Publication Data

US 2003/0062807 A1    Apr. 3, 2003

(30) Foreign Application Priority Data

Aug. 31, 2001 (JP) .............................. 2001-263857
Aug. 27, 2002 (JP) .............................. 2002-246484

(51) Int. Cl.
*H01L 41/08* (2006.01)

(52) U.S. Cl. ...................................... 310/364; 310/330
(58) Field of Classification Search ................ 310/364, 310/328, 338, 331
See application file for complete search history.

(56) References Cited

U.S. PATENT DOCUMENTS

| | | | |
|---|---|---|---|
| 5,210,455 A | 5/1993 | Takeuchi et al. | |
| 5,504,388 A * | 4/1996 | Kimura et al. | 310/363 |
| 5,691,593 A | 11/1997 | Takeuchi et al. | |
| 5,728,636 A | 3/1998 | Nawa et al. | |
| 5,767,612 A | 6/1998 | Takeuchi et al. | |
| 5,814,920 A | 9/1998 | Takeuchi et al. | |
| 6,088,893 A | 7/2000 | Takeuchi et al. | |
| 6,091,182 A | 7/2000 | Takeuchi et al. | |
| 6,108,880 A | 8/2000 | Takeuchi et al. | |
| 6,265,811 B1 | 7/2001 | Takeuchi et al. | |
| 6,297,578 B1 | 10/2001 | Takeuchi et al. | |
| 2002/0014816 A1 | 2/2002 | Takeuchi et al. | |

FOREIGN PATENT DOCUMENTS

| | | |
|---|---|---|
| EP | 0615295 | 9/1994 |
| EP | 0 675 477 | 10/1995 |
| EP | 0 713 255 | 5/1996 |
| EP | 0468796 | 4/1999 |
| EP | 1 263 059 | 12/2002 |
| JP | 3-128681 | 5/1991 |
| JP | 04-337681 | 11/1992 |
| JP | 05-030763 | 2/1993 |
| JP | 5-49270 | 2/1993 |
| JP | 06-024842 | 2/1994 |
| JP | 07-287176 | 10/1995 |

(Continued)

OTHER PUBLICATIONS

Anzai, K., "Preparation of Electronic Materials by Electrophoretic Deposition", Denki Kagaku 53, No. 1 (1985), pp. 63-68 (w/English Translation).

(Continued)

*Primary Examiner*—Mark Budd
(74) *Attorney, Agent, or Firm*—Burr & Brown

(57) ABSTRACT

A ceramic device has an actuator element which includes a shape-retaining layer, an upper electrode formed on an upper portion of the shape-retaining layer, and a lower electrode formed on a lower portion of the shape-retaining layer. A vibrating section of ceramics supports the actuator element and a fixed section of ceramics vibratingly supports the vibrating section. An electrode material of the lower electrode contacting the vibrating section contains an additive in an amount of 0.01% by weight to 20% by weight. The electrode material contains platinum as a major component, for example. The additive to the electrode material is preferably zirconium oxide, cerium oxide, or titanium oxide.

8 Claims, 16 Drawing Sheets

FOREIGN PATENT DOCUMENTS

| JP | 08-148697 | 6/1996 |
|----|-----------|--------|
| JP | 08-181360 | 7/1996 |
| JP | 08-268755 | 10/1996 |
| JP | 09-186372 | 7/1997 |
| JP | 10-211698 | 8/1998 |
| JP | 11-121820 | 4/1999 |
| WO | 02/052657 | 7/2002 |

OTHER PUBLICATIONS

Goto, A.; Hamagami, J.; Umegaki, T.; and Yamashita, K., "$PbZrO_3/PbTiO_3$ Composite Ceramics Fabricated by Electrophoretic Deposition," Proceedings of First Symposium on Higher-Order Ceramic Formation Method Based on Electrophoresis 1998, pp. 5-6 (w/English Translation).

Yamashita, K., "Hybridization of Ceramics by Electrophoretic Deposition," Proceedings of First Symposium on Higher-Order Ceramic Formation Method Based on Electrophoresis 1998, pp. 23-24 (w/English Translation).

U.S. Appl. No. 10/230,772, filed Aug. 29, 2002, Takeuchi et al.

U.S. Appl. No. 09/861,738, filed May 21, 2001, Takeuchi et al.

U.S. Appl. No. 10/225,946, filed Aug. 22, 2002, Takeuchi et al.

U.S. Appl. No. 10/236,754, filed Sep. 6, 2002, Takeuchi et al.

U.S. Appl. No. 10/265,933, filed Oct. 7, 2002, Takeuchi et al.

* cited by examiner

CERAMIC DEVICE

BACKGROUND OF THE INVENTION

1. Field of the Invention

The present invention relates to a ceramic device which is usable as a passive device, an active device, and a sensor device. The passive device includes, for example, various transducers, various actuators, frequency region functional parts (filters), and transformers. The active device includes, for example, vibrators, resonators, oscillators, and discriminators for the communication and the power generation. The sensor device includes, for example, ultrasonic sensors, acceleration sensors, angular velocity sensors, shock sensors, and mass sensors.

2. Description of the Related Art

Nowadays, a displacement device which adjusts the optical path length and the position to the submicron order is used in the fields of the optics and the precision machining, for example. The displacement device includes an actuator utilizing the inverse piezoelectric effect caused when an electric field is applied to a piezoelectric/electrostrictive material.

As for the actuator, the present applicant has already proposed a piezoelectric/electrostrictive film type device made of ceramics which is used for various purposes, for example, as described in Japanese Laid-Open Patent Publication Nos. 3-128681 and 5-49270.

The piezoelectric/electrostrictive film type device is a compact, inexpensive, and highly reliable electromechanical conversion device. Further, large displacement is obtained at a low driving voltage. The piezoelectric/electrostrictive film type device also has excellent features such that response is quick and generated force is large. Therefore, the piezoelectric/electrostrictive film type device is useful as a component of actuators, display devices, relays, or the like.

The piezoelectric/electrostrictive film type device is mechanically displaced in accordance with inverse piezoelectric effect or electrostrictive effect by applying a voltage to an operating section (actuator element). Accordingly, when it is intended to displace the operating section upwardly and downwardly at a constant amplitude, a pulse voltage having a constant amplitude may be applied thereto.

However, when driving durability was practically examined for the operating section as described above, it was confirmed that the decrease in displacement amount (deterioration of the displacement) was caused in an extremely short period if a coating made of resin or the like was applied to the surface of the operating section as a load to suppress the displacement action. This phenomenon was not observed when the operating section was examined singly.

SUMMARY OF THE INVENTION

The present invention has been made taking the foregoing problems into consideration. The object of the present invention is to provide (1) a ceramic device which makes it possible to reduce the decrease in displacement amount that would be caused by a pulse voltage applied to an operating section for a long time even when a displacement-transmitting member is placed or formed on the operating section, and provide (2) a ceramic device which makes it possible to precisely control the displacement amount even when the ceramic device is driven for a long period of time.

The present inventors have made the following researches based on the fact that the displacement amount was decreased when the displacement action was suppressed as described above and the driving operation was carried out repeatedly under the condition.

Assuming that the deterioration of the displacement is caused by some destruction (microcracks) in the operating section, researches are carried out to improve joining performance at the interface or boundary of the operating section which tends to undergo affect of firing stress most. The interface referred to herein includes the interface between the electrode and a shape-retaining layer of a piezoelectric/electrostrictive layer or an anti-ferroelectric layer, and the interface between the electrode and a ceramic substrate.

As a result, it has been revealed that the decrease in displacement amount of the operating section has two types. The first type is based on destruction (cracks at the interface between the shape-retaining layer and the electrode). It was found out that the displacement amount cannot be restored in this type. In the second type, the balance of stress in the operating section is changed due to the suppression of the displacement action. As a result, the polarization in the shape-retaining layer is progressively changed, and the deterioration of displacement is caused. In this type, the displacement amount can be restored by heating.

Based on the above result, an additive was added to the electrode material between the ceramic substrate and the shape-retaining layer. As a result, the decrease in displacement amount (deterioration of displacement) was successfully reduced even if a coating of resin was applied to the surface of the operating section. Especially, when zirconium oxide, cerium oxide, or titanium oxide was used as the additive, the decrease in displacement amount was greatly improved. In particular, when cerium oxide or titanium oxide was used, the displacement was not decreased compared to the displacement obtained when only the operating section was used.

In view of the above, the present invention provides a ceramic device comprising an operating section having at least a pair of electrodes formed on a shape-retaining layer of a piezoelectric/electrostrictive layer or an anti-ferroelectric layer; a vibrating section of ceramics and supporting the operating section, at least one electrode of the electrodes contacting the vibrating section; and a fixed section of ceramics vibratingly supporting the vibrating section, wherein the vibrating section, the electrode contacting the vibrating section, and the shape-retaining layer are integrally fired, and wherein at least the electrode contacting the vibrating section comprises an electrode material containing a minute amount of an additive.

It is preferable that the additive is a ceramic material. In this case, it is preferable that the ceramic material is at least one or more materials selected from the group consisting of zirconium oxide, cerium oxide, hafnium oxide, titanium oxide, and materials of the piezoelectric/electrostrictive layer or the anti-ferroelectric layer. More preferably, the ceramic material is at least one or more materials selected from the group consisting of zirconium oxide, cerium oxide, and titanium oxide.

The function of the present invention will now be considered, as classified by the types concerning the decrease in displacement amount of the operating section as described above. At first, as for the first type, even when no improvement is observed in joining performance between the ceramic substrate and the electrode by adding the additive to the electrode material, the decrease in displacement amount is improved on condition that the joining performance is improved between the shape-retaining layer and the electrode. A great improvement has been observed even when the additive is added in an extremely small amount.

According to this fact, when the vibrating section, the electrode contacting the vibrating section, and the shape-retaining layer are integrally fired, the joining performance between the shape-retaining layer and the electrode more greatly attributes to the improvement in decrease of the displacement amount as compared with the joining performance between the electrode and the ceramic substrate, when some object or the like suppressing displacement exists.

On the other hand, as for the second type, it is considered that the firing stress generated during the firing is changed by adding the additive to the electrode material. In relation to this point, when the vibrating section, the electrode contacting the vibrating section, and the shape-retaining layer are integrally fired, the shape-retaining layer is integrated onto the ceramic substrate without using any adhesive or the like. In this situation, the shape-retaining layer is shrunk by firing, and thus in the shape-retaining layer, the internal stress is generated in the vicinity of the joining surface.

When a coating or the like of resin is formed on the surface of the operating section in such a state (state in which the stress exists at the joining surface of the shape-retaining layer), the balance of internal stress of the shape-retaining layer is changed. When the electric power is continuously applied in driving, polarization is progressively changed, and thus the decrease in displacement amount is caused.

If the operating section subjected to the decrease in displacement amount is heated at a temperature of not less than the Curie temperature, the shape-retaining layer is depolarized and polarized again, the polarization is restored and the displacement amount is returned.

On the other hand, if the additive is added to the lower electrode, for example, the piezoelectric/electrostrictive member of the shape-retaining layer shrinks differently compared to the other layers during the firing, when the shape-retaining layer is integrated into one unit by means of the firing. As a result, the internal stress of the shape-retaining layer after the firing is changed. Therefore, even when some coating is formed on the surface of the operating section, and the electric power is continuously applied, then the polarization state is changed extremely minutely, and the decrease in displacement amount is suppressed.

According to the above fact, in the present invention, even when the displacement-transmitting member is placed or formed on the operating section, it is possible to suppress the decrease in displacement amount caused by the pulse voltage applied to the operating section for a long time. It is possible to continuously control the displacement amount in a precise manner even when the device is driven for a long period of time.

It is also preferable that the pair of electrodes include an upper electrode formed on an upper portion of the shape-retaining layer, and a lower electrode formed between the shape-retaining layer and the vibrating section. In these arrangements, the lower electrode contacting the vibrating section comprises the electrode material containing the minute amount of the additive. Of course, both of the pair of electrodes are formed to contact the vibrating section. In this arrangement, it is preferable that both of the pair of electrodes comprise the electrode material containing the minute amount of the additive.

It is preferable that at least the electrode material of the electrode contacting the vibrating section contains an element of the platinum group, an alloy of the element of the platinum group and gold and/or silver, an alloy of elements of the platinum group, or an alloy of the alloy of the element of the platinum group and gold and/or silver. More preferably, the electrode material contains platinum as a major component.

It is preferable that the additive is contained in the electrode material in an amount of 0.01% by weight to 20% by weight. More preferably, the additive is contained in the electrode material in an amount of 0.1% by weight to 10% by weight.

A ceramic material is preferably used for the additive. In this case, it is preferable to use at least one or more materials selected from the group consisting of zirconium oxide, cerium oxide, hafnium oxide, titanium oxide, and materials of the piezoelectric/electrostrictive layer or the anti-ferroelectric layer. It is preferable that the additive has an average particle diameter of 0.01 to 1.0 $\mu$m if the materials are selected from the group consisting of zirconium oxide, cerium oxide, and hafnium oxide. It is preferable that the additive has an average particle diameter of 0.1 to 10.0 $\mu$m if the materials are selected from the group consisting of titanium oxide and materials of the piezoelectric/electrostrictive layer or the anti-ferroelectric layer.

The above and other objects, features, and advantages of the present invention will become more apparent from the following description when taken in conjunction with the accompanying drawings in which a preferred embodiment of the present invention is shown by way of illustrative example.

DETAILED DESCRIPTION OF THE INVENTION

Illustrative embodiments of the ceramic device according to the present invention will be explained below with reference to FIGS. 1 to 16.

Figure 1:
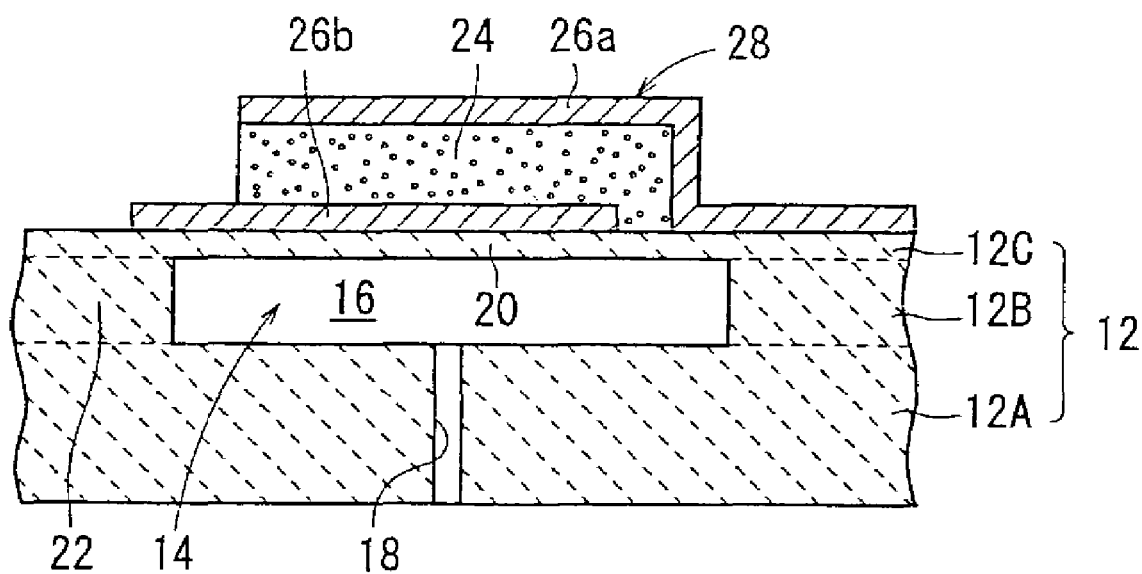
FIG. 1 is a sectional view illustrating, with partial omission, a ceramic device according to an embodiment of the present invention.

As shown in FIG. 1, a ceramic device 10 according to an embodiment of the present invention comprises an actuator substrate 12 which is made of, for example, ceramics, and actuator elements 14 which are displaced in accordance with application of the voltage.

Cavities 16 for respective vibrating sections described later on are provided in the actuator substrate 12 at positions corresponding to the portions at which the respective actuator elements 14 are to be formed. The respective cavities 16 communicate with the outside via through-holes 18 each of which has a small diameter and opened in a surface of the actuator substrate 12.

The actuator substrate 12 has thin-walled portions on which the cavities 16 are formed. The other portions of the actuator substrate 12 are thick-walled. Each of the thin-walled portions easily vibrates in response to external stress, and functions as a vibrating section 20. Each of the thick-walled portions other than the thin-walled portions functions as a fixed section 22 for supporting the vibrating section 20.

The actuator substrate 12 has a stacked structure comprising a lowermost substrate layer 12A, an intermediate spacer layer 12B, and an uppermost thin plate layer 12C. The actuator substrate 12 can be an integrated structure including the cavities 16 formed at the positions in the spacer layer 12B corresponding to the actuator elements 14. The substrate layer 12A functions as a substrate for reinforcement, and also functions as a substrate for wiring. The actuator substrate 12 may be of an integrally fired structure or may be made up of layers laminated end fired successively. Further alternatively, the respective layers may be individually fired, and then they may be laminated and integrated into one unit.

Each of the actuator elements 14 comprises the vibrating section 20, the fixed section 22, and a main actuator element 28 which has a shape-retaining layer 24 such as a piezo-electric/electrostrictive layer or an anti-ferroelectric layer directly formed on the vibrating section 20, and a pair of electrodes (an upper electrode 26a and a lower electrode 26b) formed on an upper surface and a lower surface of the shape-retaining layer 24.

Figure 2:
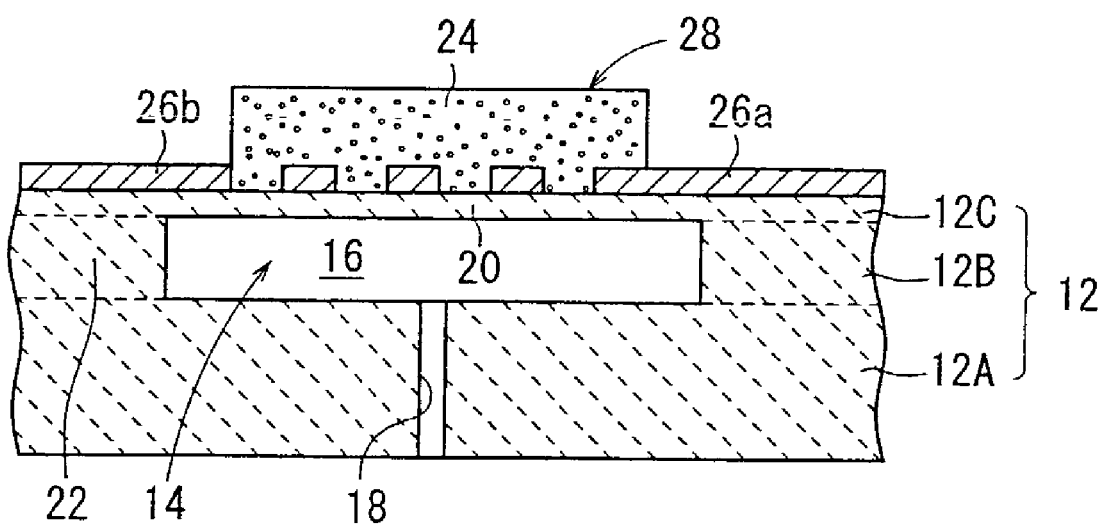
FIG. 2 is a sectional view illustrating a first modified embodiment of an electrode structure of the ceramic device according to the embodiment of the present invention.
Figure 3:
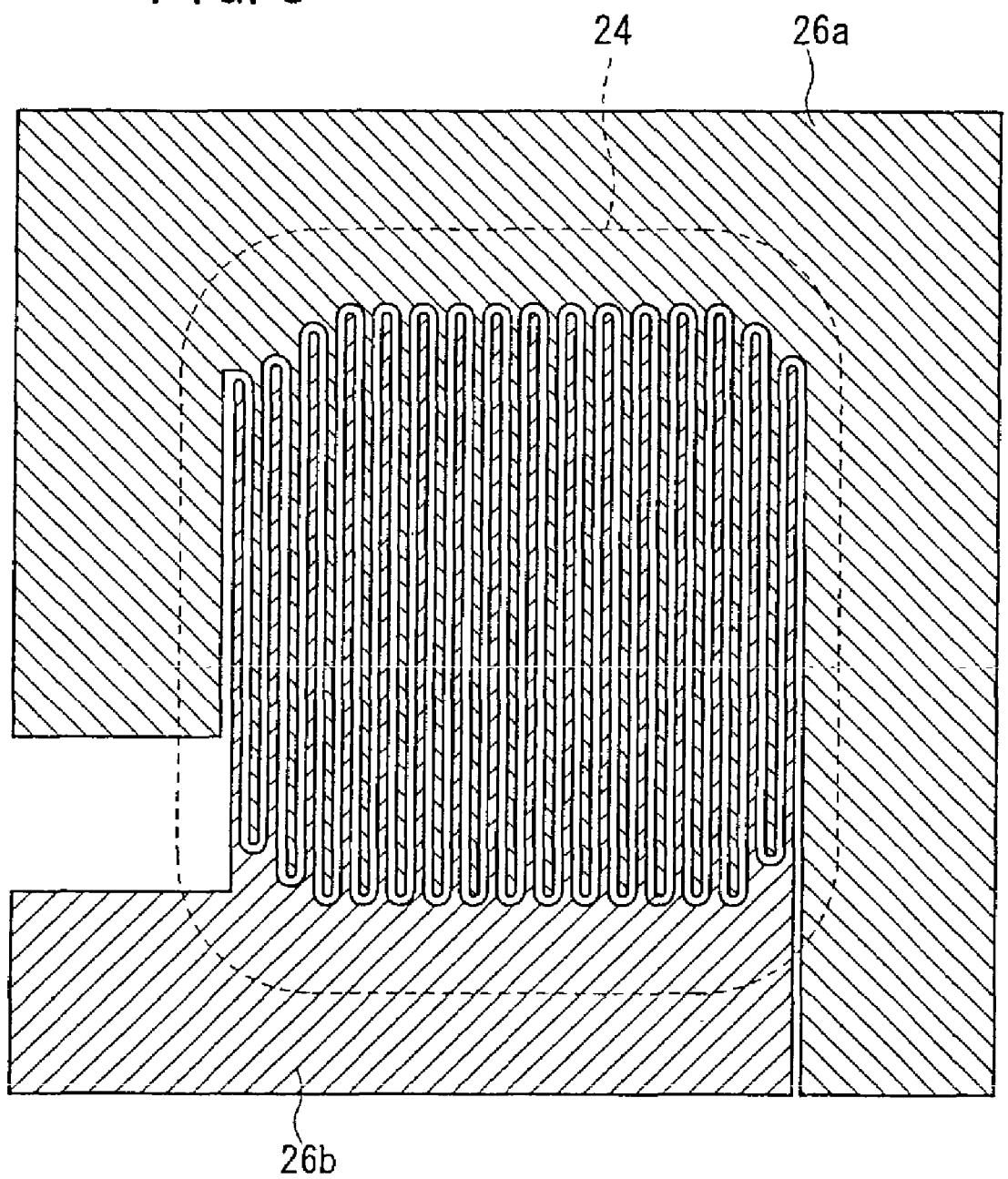
FIG. 3 is a bottom view, illustrating the electrode structure according to the first modified embodiment.
Figure 4:
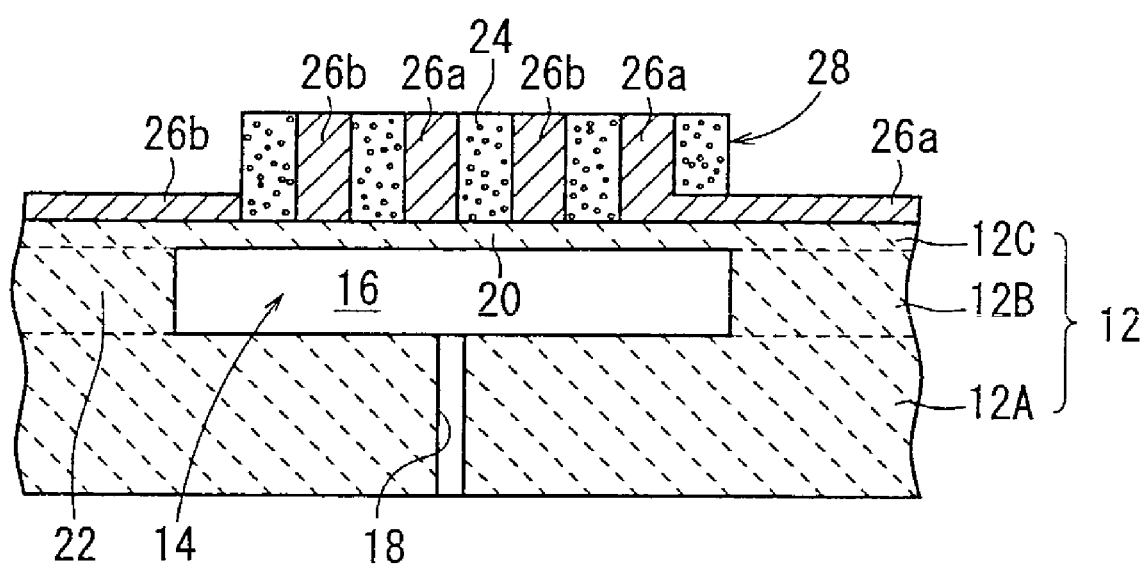
FIG. 4 is a sectional view illustrating a second modified embodiment of the electrode structure of the ceramic device according to the embodiment of the present invention.

The pair of electrodes may be structured as follows other than the upper electrode 26a and the lower electrode 26b described above. As shown in FIGS. 2 and 3, a pair of comb-shaped electrodes 26a, 26b may be formed between the shape-retaining layer 24 and the vibrating section 20. Alternatively, as shown in FIG. 4, a pair of comb-shaped electrodes 26a, 26b may be formed and embedded in the shape-retaining layer 24. In these arrangements, the pair of electrodes 26a, 26b are formed so that both of the lower surfaces thereof make contact with the vibrating section 20.

The structure shown in FIGS. 2 and 3 is advantageous in that the electric power consumption can be lowered. The structure shown in FIG. 4 is advantageous to generate large displacement, because this structure can effectively utilize inverse piezoelectric effect in the electric field direction in which strain and generated force are large.

Figure 5:
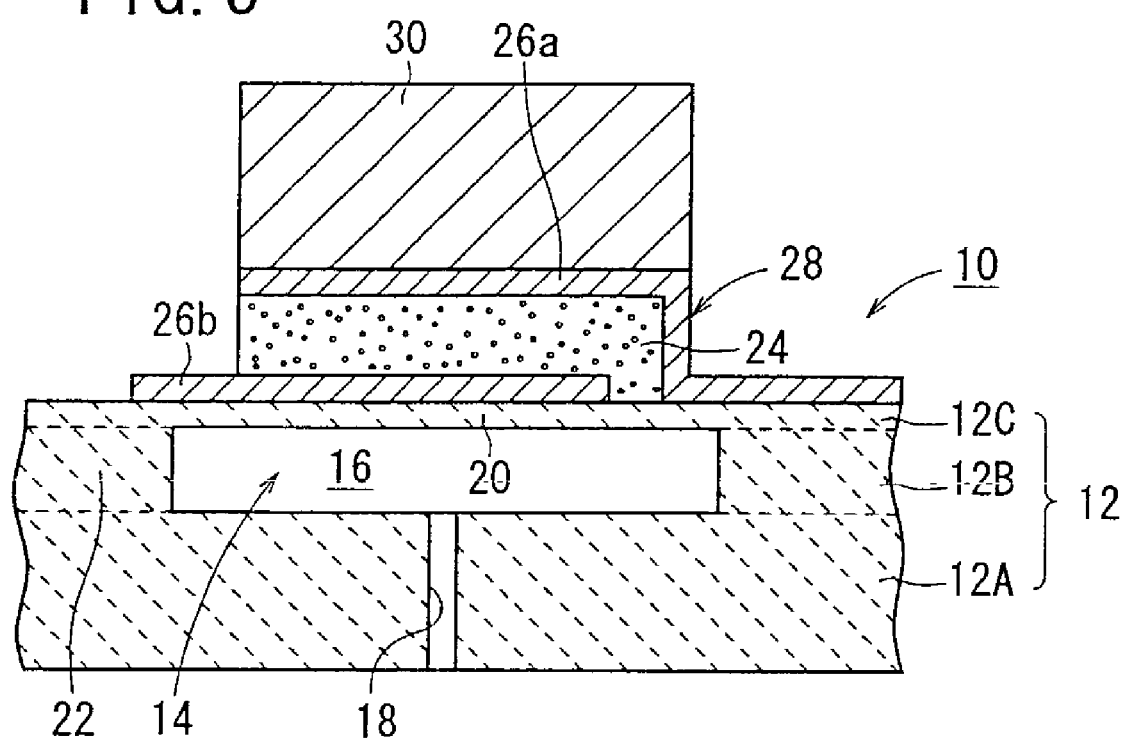
FIG. 5 shows an arrangement illustrating a state in which a displacement-transmitting section is placed or formed on an actuator element of the ceramic device according to the embodiment of the present invention.

As shown in FIG. 5, a displacement-transmitting member 30 is placed or formed on the upper portion of the actuator element 14. The displacement-transmitting member 30 transmits the displacement of the actuator element 14, for example, in the upward direction. Various displacement-transmitting members 30 are used depending on the embodiments of the ceramic device 10.

Figure 6:
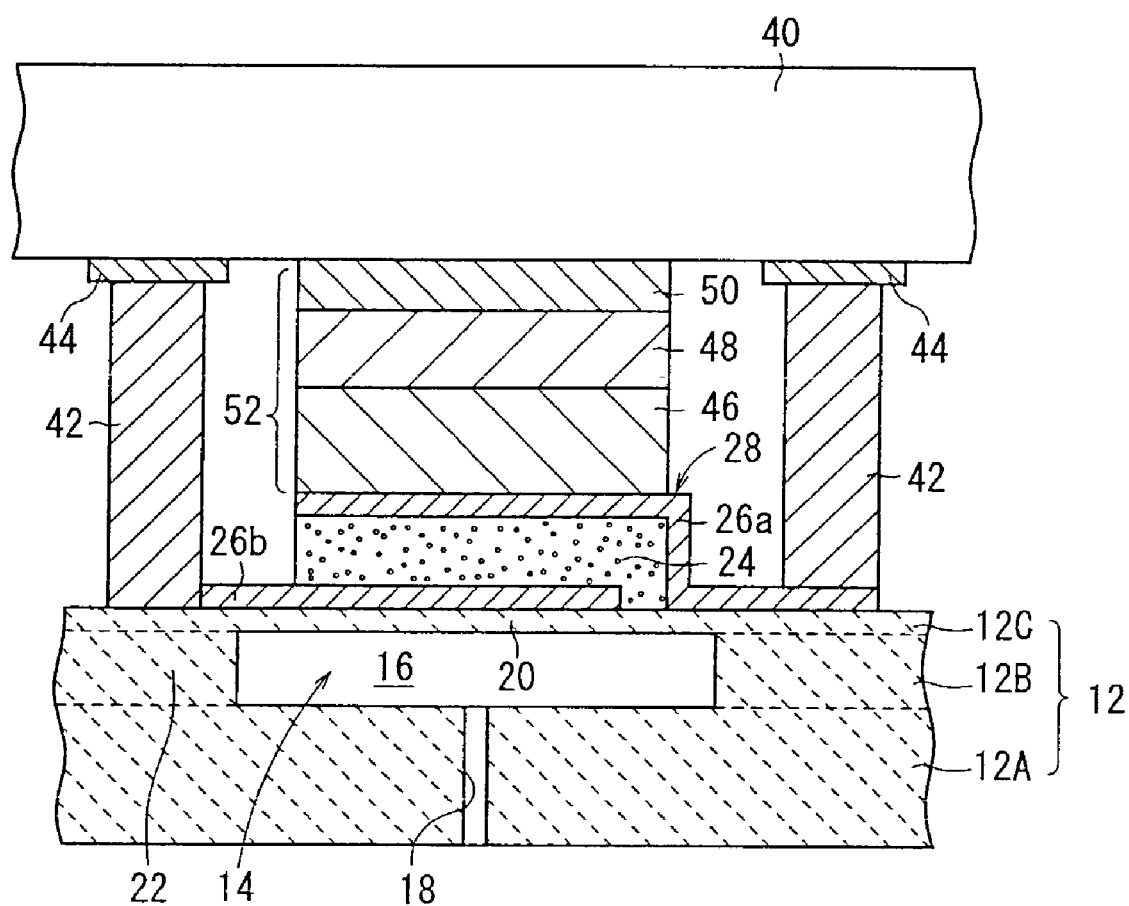
FIG. 6 shows, with partial omission, an exemplary arrangement in which the ceramic device according to the embodiment of the present invention is applied to a display device.

For example, when the ceramic device 10 is used for the picture elements (image pixels) of a display device, as shown in FIG. 6, an optical waveguide plate 40 is arranged opposingly to the actuator substrate 12. A plurality of frame members 42 are formed between the optical waveguide plate 40 and the actuator substrate 12. The actuator elements 14 are arranged corresponding to the respective picture elements. FIG. 6 shows that light-shielding layers 44 are formed between the optical waveguide plate 40 and the frame members 42 respectively.

A picture element assembly 52 has a stack of resin layers including, for example, a white scattering element 46, a color layer 48, and a transparent layer 50, and is formed on each of the actuator elements 14. The picture element assembly 52 contacts or separates from the optical waveguide plate 40 in accordance with the displacement action of the actuator element 14.

Light is introduced from an unillustrated light source into the optical waveguide plate 40. When the end surface of the picture element assembly 52 contacts the optical waveguide plate 40 in accordance with the displacement action of the actuator element 14, light is emitted from a position corresponding to the picture element assembly 52 of a front surface (display surface) of the optical waveguide plate 40. In other words, an image is displayed on the display surface by controlling the presence or absence of light emission (leakage light) from the display surface in accordance with the presence or absence of the contact of the picture element assembly 52 with the optical waveguide plate 40.

For example, in the structure as shown in FIGS. 5 and 6, the thickness of the thin plate layer 12C is usually not more than 50 $\mu$m and preferably about 3 to 20 $\mu$m in order to greatly displace the actuator element 14.

Figure 7:
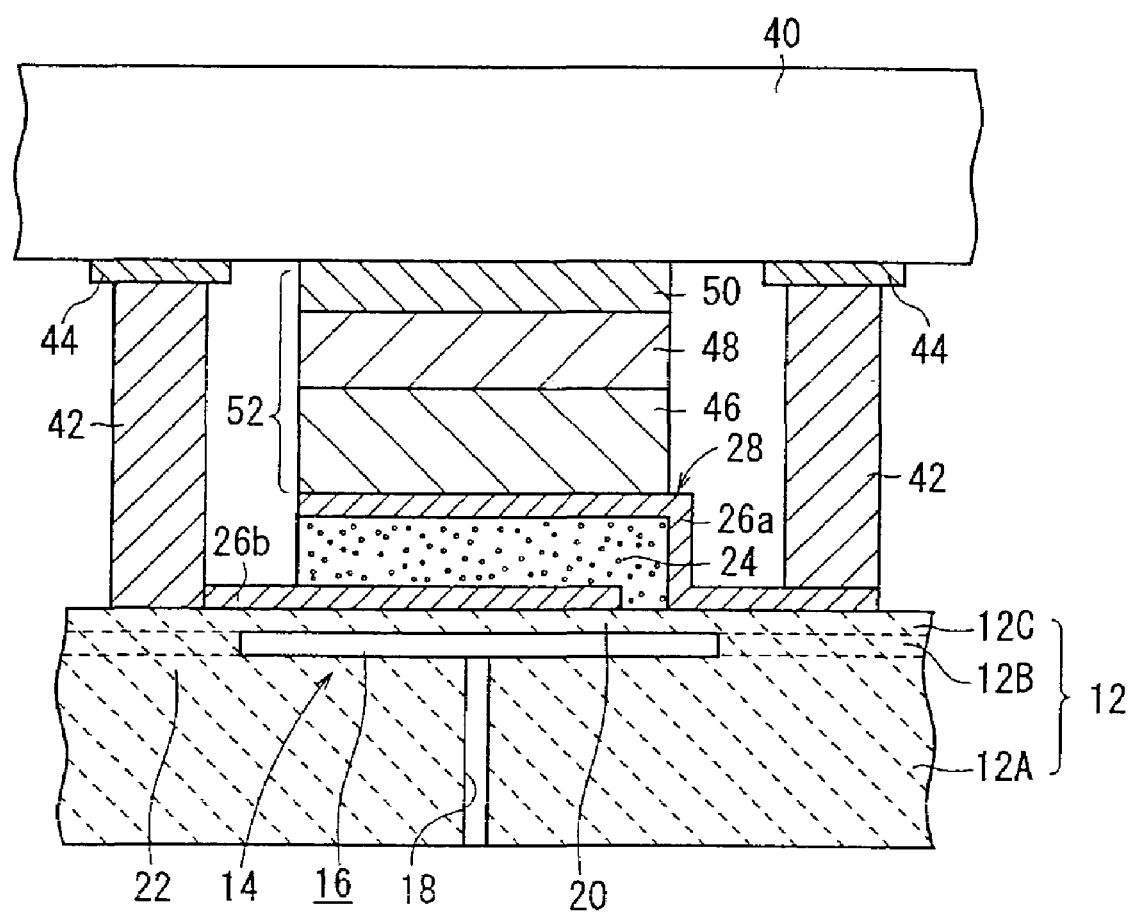
FIG. 7 shows, with partial omission, another exemplary arrangement in which the ceramic device according to the embodiment of the present invention is applied to a display device.

The spacer layer 12B constitutes the cavities 16 in the actuator substrate 12, and the thickness of the spacer layer 12B is not specifically limited. However, on the other hand, the thickness may be determined depending on the purpose of the cavity 16. Especially, the thickness of the spacer layer 12B is not more than a thickness which is necessary for the actuator element 14 to function. For example, as shown in FIG. 7, the thin spacer layer 12B is preferable. That is, it is preferable that the thickness of the spacer layer 12B is substantially the same with the magnitude of the displacement of the actuator element 14.

In the arrangement as described above, the flexion of the thin-walled portion (portion of the vibrating section 20) is restricted by the substrate layer 12A which is close to the vibrating section 20 in the direction of flexion. It is possible to prevent the thin-walled portion from being broken by some unintentional external force. It is also possible to stabilize the displacement of the actuator element 14 to be a determined value by restricting the flexion by the substrate layer 12A.

When the spacer layer 12B is thin, then the thickness of the actuator substrate 12 is decreased, and it is possible to decrease flexural rigidity. Accordingly, when the actuator substrate 12 is bonded and fixed to another member, then the warpage or the like of the subject (in this case, the actuator substrate 12) is effectively corrected with respect to the object (for example, the optical waveguide plate 40), and it is possible to improve the reliability of bonding and fixing.

Additionally, the actuator substrate 12 is thin as a whole, and hence it is possible to reduce the amount of raw materials when the actuator substrate 12 is produced. This structure is also advantageous in view of production cost. Therefore, in particular, it is preferable that the thickness of the spacer layer 12B is 3 to 50 $\mu$m. Especially, it is preferable that the thickness of the spacer layer 12B is 3 to 20 $\mu$m.

On the other hand, the thickness of the substrate layer 12A is generally not less than 50 $\mu$m and preferably about 80 to 300 $\mu$m in order to reinforce the entire actuator substrate 12, because the spacer layer 12B is thin as described above.

Next, explanation will be made for the respective constitutive members of the ceramic device 10, especially for the selection of the material or the like for the respective constitutive members.

At first, it is preferable that the vibrating section 20 is made of a highly heat-resistant material, for the following reason. When the main actuator element 28 is stacked on the vibrating section 20 without using any material such as an organic adhesive which is inferior in heat resistance, the vibrating section 20 is preferably made of a highly heat-resistant material in order that the vibrating section 20 is not deteriorated in quality at least during the formation of the shape-retaining layer 24 which is performed at high temperature.

It is preferable that the vibrating section 20 is made of an electrically insulative material in order to electrically separate the wires connected to the upper electrode 26a formed on the actuator substrate 12 from the wires connected to the lower electrode 26b.

Therefore, the vibrating section 20 may be made of a material such as a highly heat-resistant metal or a porcelain enamel produced by coating a surface of a metal with a ceramic material such as glass. However, the vibrating section 20 is optimally made of ceramics.

The vibrating section 20 is made of ceramics such as stabilized zirconium oxide, aluminum oxide, magnesium oxide, titanium oxide, spinel, mullite, aluminum nitride, silicon nitride, glass, or mixtures of these ceramics. Stabilized zirconium oxide is especially preferred because of high mechanical strength obtained even if the thickness of the vibrating section 20 is thin, high toughness, and small chemical reactivity with the shape-retaining layer 24 and the pair of electrodes 26a, 26b. The term "stabilized zirconium oxide" includes fully stabilized zirconium oxide and partially stabilized zirconium oxide. Stabilized zirconium oxide has a crystal structure such as cubic crystal, and hence it does not cause phase transition.

On the other hand, zirconium oxide causes phase transition between monoclinic crystal and tetragonal crystal at about 1000° C. Cracks may appear during the phase transition in some cases. Stabilized zirconium oxide contains 1 to 30 mole % of a stabilizer such as calcium oxide, magnesium oxide, yttrium oxide, scandium oxide, ytterbium oxide, cerium oxide, and oxides of rare earth metals. In order to enhance the mechanical strength of the vibrating section 20, it is preferable that the stabilizer contains yttrium oxide. In this composition, yttrium oxide is contained preferably in an amount of 1.5 to 6 mole %, and more preferably 2 to 4 mole %. It is much more preferable that aluminum oxide is further contained in an amount of 0.1 to 5 mole %.

The crystal phase may be a mixed phase of cubic crystal and monoclinic crystal, a mixed phase of tetragonal crystal and monoclinic crystal, and a mixed phase of cubic crystal, tetragonal crystal, and monoclinic crystal. Among them, it is most preferable that a principal crystal phase is tetragonal crystal or a mixed phase of tetragonal crystal and cubic crystal, considering the strength, toughness, and durability of a device.

When the vibrating section 20 is made of ceramics, the vibrating section 20 is made up of a large number of crystal grains. In order to increase the mechanical strength of the vibrating section 20, the crystal grains preferably have an average grain diameter of 0.05 to 2 $\mu$m, and more preferably 0.1 to 1 $\mu$m.

The fixed section 22 is preferably made of ceramics. The fixed section 22 may be made of the same ceramic material as that of the vibrating section 20, or the fixed section 22 may be made of a ceramic material different from that of the vibrating section 20. The fixed section 22 is made of the ceramics such as stabilized zirconium oxide, aluminum oxide, magnesium oxide, titanium oxide, spinel, mullite, aluminum nitride, silicon nitride, glass, and mixtures of these ceramics, in the same manner as the material of the vibrating section 20.

Especially, the actuator substrate 12 used in the ceramic device is made of a material such as a material containing zirconium oxide as a major component, a material containing aluminum oxide as a major component, and a material containing a mixture of these materials as a major component. Among them, the material containing zirconium oxide as a major component is more preferable.

Clay or the like may be added as a sintering aid in some cases. It is necessary to control components of the sintering aid in order not to contain an excessive amount of materials liable to form glass such as silicon oxide and boron oxide. Although the materials which are liable to form glass are advantageous to join the actuator substrate 12 to the shape-retaining layer 24, the materials facilitate the reaction between the actuator substrate 12 and the shape-retaining layer 24, making it difficult to maintain a predetermined composition of the shape-retaining layer 24. As a result, the device characteristics would be deteriorated.

It is preferable that silicon oxide or the like in the actuator substrate 12 is restricted to have a weight ratio of not more than 3%, and more preferably not more than 1%. The term "major component" herein refers to a component which exists in a proportion of not less than 50% by weight.

As described above, the shape-retaining layer 24 can be a piezoelectric/electrostrictive layer or an anti-ferroelectric layer. However, when the piezoelectric/electrostrictive layer is used as the shape-retaining layer 24, the piezoelectric/electrostrictive layer may be made of ceramics such as lead zirconate, lead magnesium niobate, lead nickel niobate, lead zinc niobate, lead manganese niobate, lead magnesium tantalate, lead nickel tantalate, lead antimony stannate, lead titanate, barium titanate, lead magnesium tungstate, and lead cobalt niobate, or a combination of these ceramics.

The major component may contain the compound as described above in an amount of not less than 50% by weight. Among the ceramic materials described above, the ceramic material containing lead zirconate is most frequently used for the piezoelectric/electrostrictive layer of the shape-retaining layer 24.

When the piezoelectric/electrostrictive layer is made of ceramics, it is also preferable to use ceramics including as an additive, oxide of, lanthanum, calcium, strontium, molybdenum, tungsten, barium, niobium, zinc, nickel, or manganese, or a combination of these materials or another type of compound (i.e., nitride or the like) thereof.

For example, it is preferable to use ceramics containing lead magnesium niobate, lead zirconate, and lead titanate as a major component and further containing lanthanum and/or strontium.

The piezoelectric/electrostrictive layer may be either dense or porous. When the piezoelectric/electrostrictive layer is porous, its porosity is preferably not more than 40%.

When the anti-ferroelectric layer is used as the shape-retaining layer 24, it is desirable to use, as the anti-ferroelectric layer, a compound containing lead zirconate as a major component, a compound containing lead zirconate and lead stannate as major components, a compound obtained by adding lanthanum oxide to lead zirconate, and a compound obtained by adding lead zirconate and/or lead niobate to a component containing lead zirconate and lead stannate.

Especially, when an anti-ferroelectric film containing lead zirconate and lead stannate as represented by the following composition is used as a film-type element such as the actuator element 14, it is possible to perform the driving at a relatively low voltage. Therefore, such an anti-ferroelectric film is especially preferred.

$$Pb_{0.99}Nb_{0.02}[(Zr_xSn_{1-x})_{1-y}Ti_y]0.98O_3$$

wherein, $0.5<x<0.6$, $0.05<y<0.063$, and $0.01<Nb<0.03$.

The anti-ferroelectric film may be porous. When the anti-ferroelectric film is porous, it is desirable that the porosity is not more than 30%.

The shape-retaining layer 24 may be formed on the vibrating section 20 by various thick film formation methods such as a screen printing method, a dipping method, a coating method, and an electrophoresis method, or various thin film formation methods such as an ion beam method, a sputtering method, a vacuum evaporation method, an ion plating method, a chemical vapor deposition method (CVD), and a plating method.

In this embodiment, the shape-retaining layer 24 is preferably formed on the vibrating section 20 by the thick film formation method such as a screen printing method, a dipping method, a coating method, and an electrophoresis method, for the following reason.

In the methods described above, the shape-retaining layer 24 can be formed by using paste, slurry, suspension, emulsion, or sol containing piezoelectric ceramic particles having an average particle size of 0.01 to 5 $\mu$m, preferably 0.05 to 3 $\mu$m as a major component, in which it is possible to obtain good piezoelectric operation characteristics.

Especially, the electrophoresis method makes it possible to form the film at a high density with a high shape accuracy, and also has the features as described in technical literatures such as "Preparation of Electronic Materials by Electrophoretic Deposition" written by Kazuo ANZAI, Electrochemistry 53, No. 1 (1985), pp. 63–68, and "Proceedings of First Symposium on Higher-Order Ceramic Formation Method Based on Electrophoresis 1998, pp. 5–6 and pp. 23–24". Therefore, one of the methods may be appropriately selected and used considering the required accuracy and the reliability.

It is preferable that the thickness of the vibrating section 20 has substantially the same dimension as the thickness of the shape-retaining layer 24. If the thickness of the vibrating section 20 is extremely thicker than the thickness of the shape-retaining layer 24 (if the former is larger than the latter by at least ten times), the vibrating section 20 would work to prevent the shape-retaining layer 24 from shrinking when the shape-retaining layer 24 is fired. For this reason, the stress at the boundary surface between the shape-retaining layer 24 and the actuator substrate 12 is increased, and consequently the shape-retaining layer 24 is easily peeled off from the actuator substrate 12. In contrast, when the thickness of the shape-retaining layer 24 is substantially the same with the thickness of the actuator substrate 12, it is easy for the actuator substrate 12 (vibrating section 20) to follow the shrinkage of the shape-retaining layer 24 upon firing, allowing the shape-retaining layer 24 and the actuator substrate 12 to be appropriately combined with each other. Specifically, the vibrating section 20 preferably has a thickness of 1 to 100 $\mu$m, more preferably 3 to 50 $\mu$m, and much more preferably 5 to 20 $\mu$m. The shape-retaining layer 24 preferably has a thickness of 5 to 100 $\mu$m, more preferably 5 to 50 $\mu$m, and much more preferably 5 to 30 $\mu$m.

The upper electrode 26a and the lower electrode 26b formed on the upper surface and the lower surface of the shape-retaining layer 24, the pair of electrodes 26a, 26b formed between the shape-retaining layer 24 and the vibrating section 20 as shown in FIGS. 2 and 3, or the pair of electrodes 26a, 26b formed by being embedded in the shape-retaining layer 24 have an appropriate thickness depending on how they are used. However, the thickness is preferably 0.01 to 50 $\mu$m, and more preferably 0.1 to 5 $\mu$m.

The material of the lower electrode 26b or the pair of electrodes 26a, 26b shown in FIGS. 2 to 4 contains an additive in an amount of 0.01% by weight to 20% by weight, and preferably contains an additive in an amount of 0.1% by weight to 10% by weight.

The electrode material contains an element of the platinum group, an alloy of the element belonging to the platinum group and gold and/or silver, an alloy of elements of the platinum group, or an alloy of the alloy of the element of the platinum group and gold and/or silver. Preferably, the electrode material contains platinum as a major component.

The additive is preferably a ceramic material. In this case, it is preferable to use at least one or more materials selected from the group consisting of zirconium oxide, cerium oxide, hafnium oxide, titanium oxide and materials of the piezoelectric/electrostrictive layer or the anti-ferroelectric layer.

The upper electrode 26a is preferably made of a conductive metal which is solid at room temperature such as aluminum, titanium, chromium, iron, cobalt, nickel, copper, zinc, niobium, molybdenum, ruthenium, rhodium, silver, stannum, tantalum, tungsten, iridium, platinum, gold, and lead. Any combination of these metals can be used for the upper electrode 26a as an alloy.

Six exemplary experiments (conveniently referred to as "first to sixth exemplary experiments") will now be explained.

The first exemplary experiment relates to a Comparative Example in which the time-dependent fluctuation of the displacement action of the actuator element was observed for the following three cases described below.

The three cases were as follows. (1) Nothing was formed on the actuator element 14 (Case 1). (2) An acrylic resin was coated on the actuator element 14 with a spin coater to form a layer having a thickness of 0.5 $\mu$m by curing the resin at 150° C. for 1 hour (Case 2). (3) A modified epoxy was printed and cured (130° C. for 1 hour) by the screen printing on the actuator element 14 to form a layer having a thickness of 10 $\mu$m (Case 3).

A ceramic device concerning the Comparative Example was prepared based on the ceramic device 10 according to the embodiment of the present invention shown in FIG. 1. The size of the cavity was 1 mm×1 mm, the thickness of the vibrating section 20 was 10 $\mu$m, lead zirconate titanate was used for the shape-retaining layer 24, the thickness of the shape-retaining layer 24 was 25 µm, the lower electrode 26b was made of Pt, the thickness of the lower electrode 26b was 3.0 µm, the upper electrode 26a was made of Au, and the thickness of the upper electrode 26a was 0.5 µm.

Figure 8:
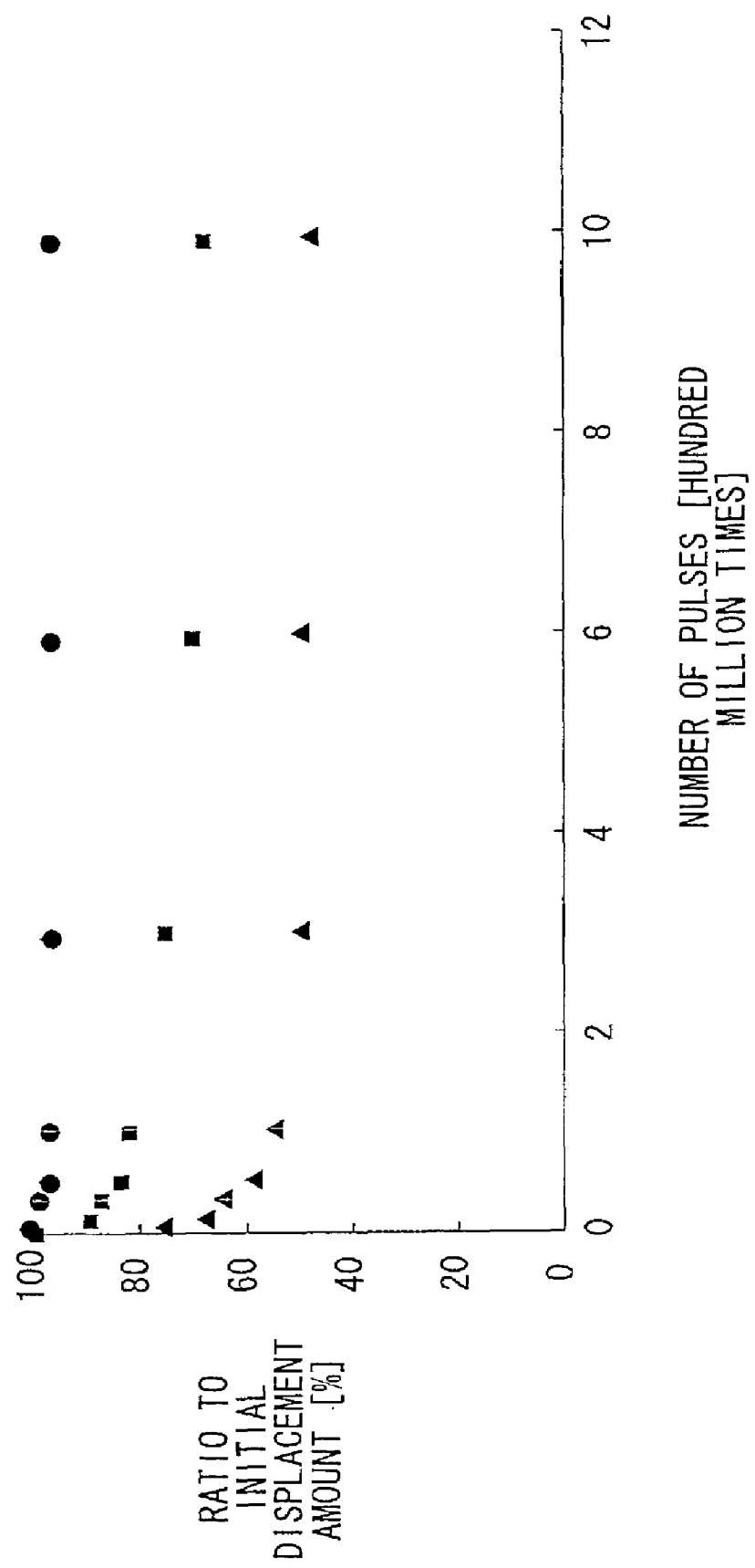
FIG. 8 shows a result obtained in a first exemplary experiment (Comparative Example)

The result of the first exemplary experiment is shown in FIG. 8. In FIG. 8, the results of Case 1 are plotted using solid circles, the result of Case 2 are plotted using solid squares, and the results of Case 3 are plotted using solid triangles. The displacement amount of the actuator element 14 for the first pulse is defined to be "initial displacement amount".

Assuming that the initial displacement amount in Case 1 was regarded as 100%, the initial displacement amount in Case 2 was 98%, and the initial displacement amount in Case 3 was 78%. It is appreciated that the initial displacement amount is lower as the layer formed on the actuator element 14 has a larger thickness and suppresses the displacement action more strongly.

The displacement amount in each case is compared when the pulses were applied one hundred million times. The displacement amount was about 98% in Case 1, which shows few change of displacement. However, the displacement amount was lowered to about 79% in Case 2, in which the degree of the change was 19%. Further, the displacement amount was lowered to about 58% in Case 3, in which the degree of the change was 20%.

In the second exemplary experiment, the time-dependent fluctuation of the displacement action of the actuator element 14 in Case 2 and Case 3 described above is observed, as Example 1.

Figure 9:
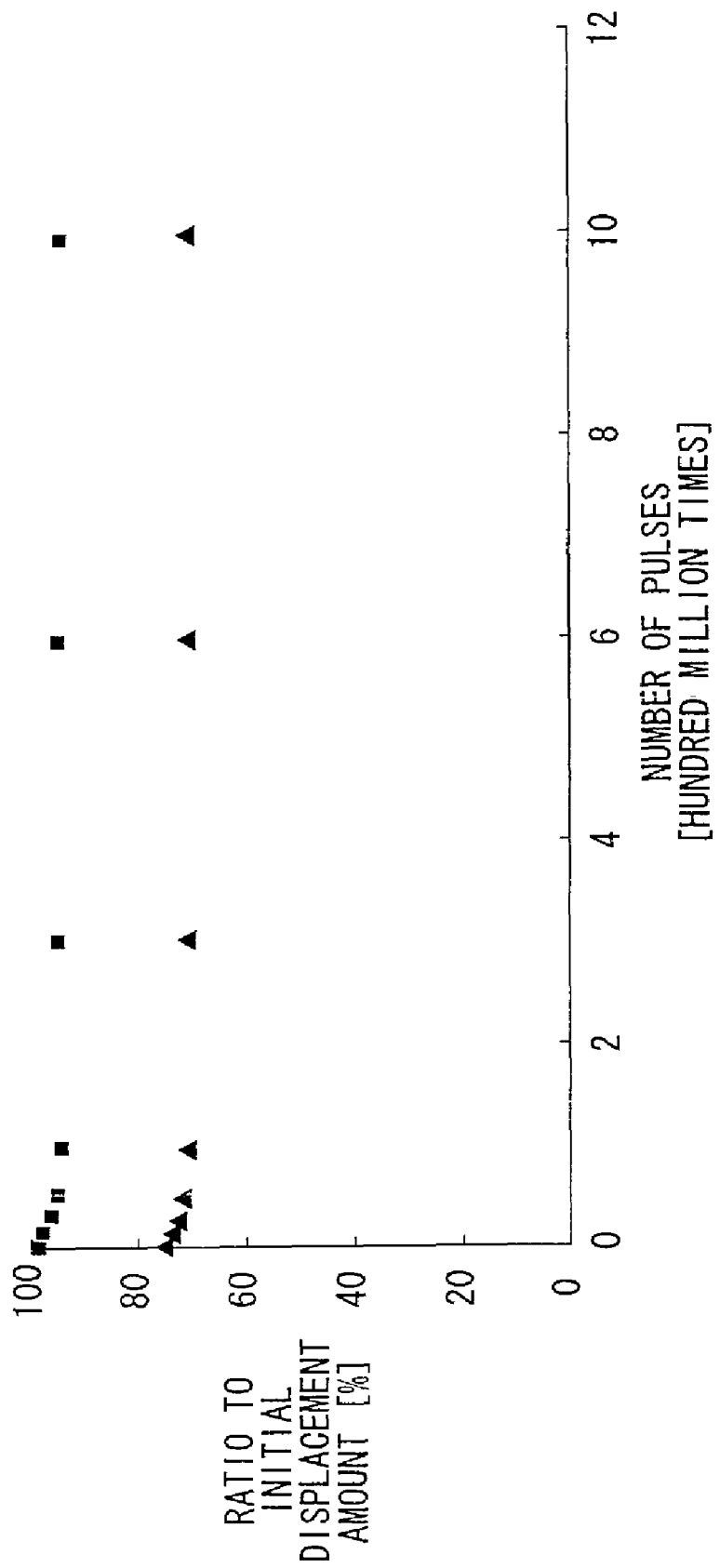
FIG. 9 shows a result obtained in a second exemplary experiment (Example 1)

A ceramic device concerning Example 1 was constructed in approximately the same manner as in the Comparative Example described above. However, the former was different from the latter in that zirconium oxide (average particle diameter was 0.09 µm) was added in an amount of 5.0% by weight to Pt in the constitutive material of the lower electrode 26b. The result of the second exemplary experiment is shown in FIG. 9. In FIG. 9, the results of Case 2 are plotted using solid squares, and the results of Case 3 are plotted using solid triangles.

In the third exemplary experiment, the time-dependent fluctuation of the displacement action of the actuator element 14 in Case 2 and Case 3 described above is observed, as Example 2.

Figure 10:
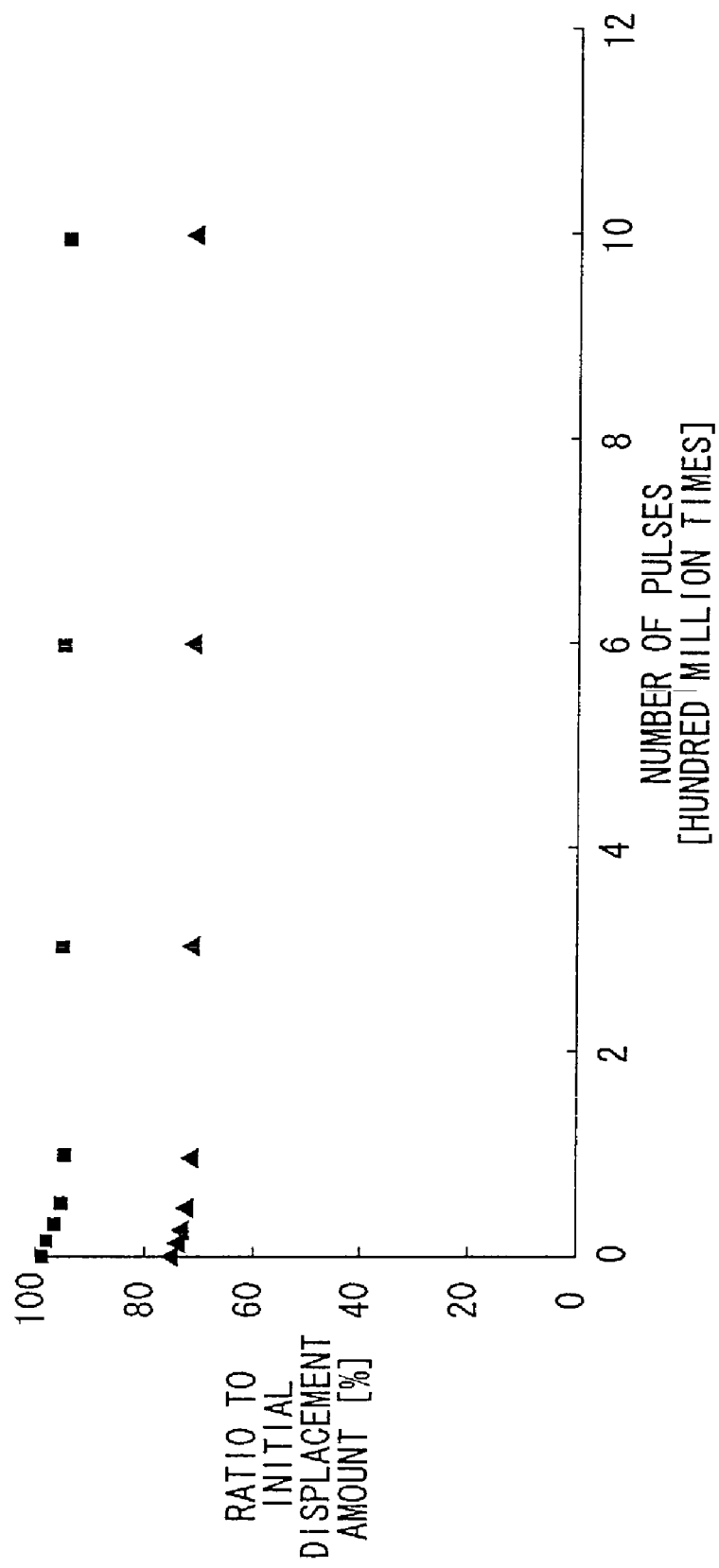
FIG. 10 shows a result obtained in a third exemplary experiment (Example 2)

A ceramic device concerning Example 2 was constructed in approximately the same manner as in the Comparative Example described above. However, the former was different from the latter in that zirconium oxide (average particle diameter was 0.04 µm) was added in an amount of 0.1% by weight to Pt in the constitutive material of the lower electrode 26b. The result of the third exemplary experiment is shown in FIG. 10. In FIG. 10, the results of Case 2 are plotted using solid squares, and results of Case 3 are plotted using solid triangles.

Next, in the fourth exemplary experiment, the time-dependent fluctuation of the displacement action of the actuator element 14 in Case 2 and Case 3 described above are observed, as Example 3.

Figure 11:
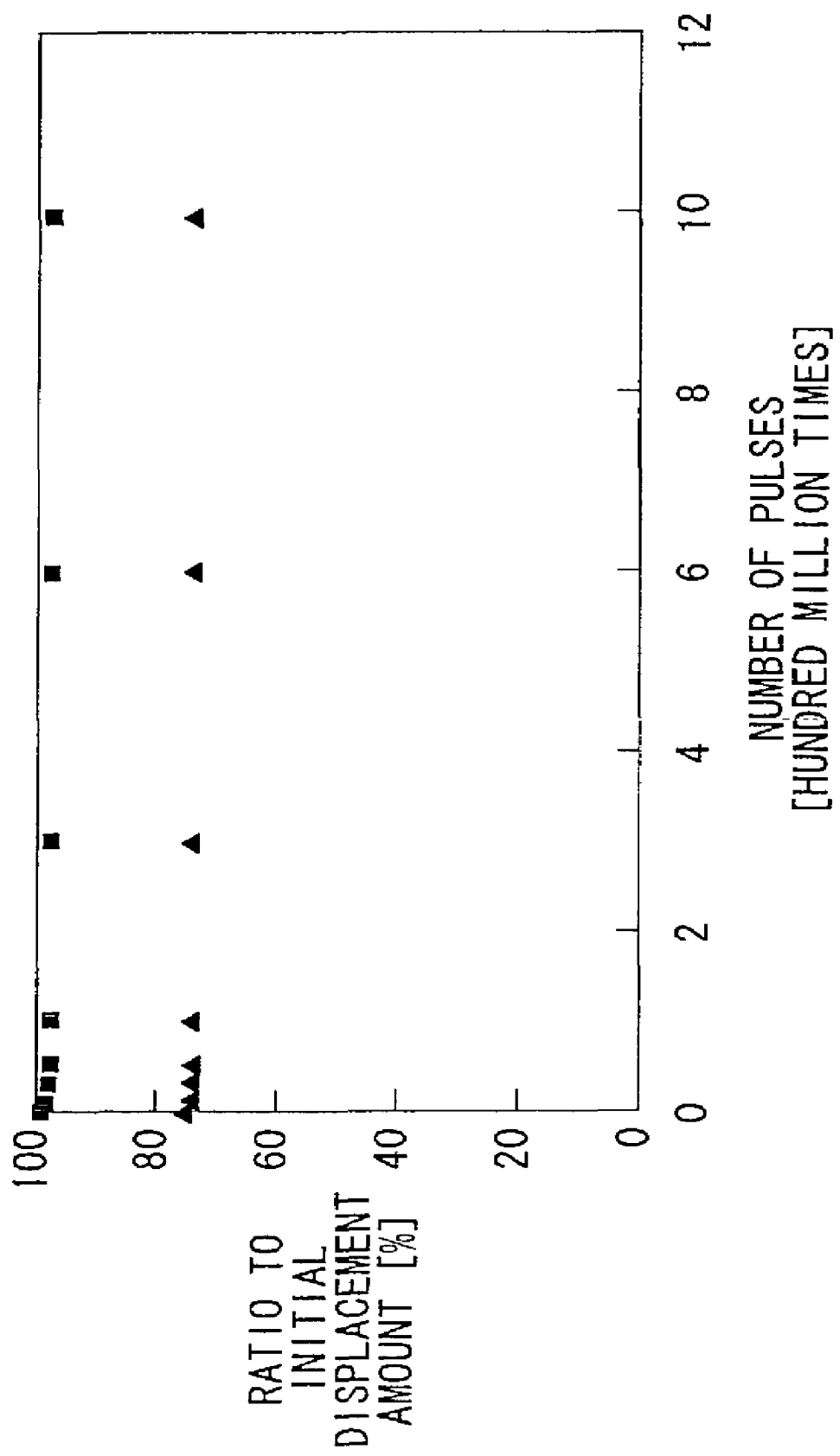
FIG. 11 shows a result obtained in a fourth exemplary experiment (Example 3)

A ceramic device concerning Example 3 was constructed in approximately the same manner as in the Comparative Example described above. However, the former was different from the latter in that cerium oxide (average particle diameter was 0.05 µm) was added in an amount of 0.5% by weight to Pt in the constitutive material of the lower electrode 26b. The result of the fourth exemplary experiment is shown in FIG. 11. In FIG. 11, the results of Case 2 are plotted using solid squares, and the results of Case 3 are plotted using solid triangles.

Next, in the fifth exemplary experiment, the time-dependent fluctuation of the displacement action of the actuator element 14 in Case 2 and Case 3 described above is observed, as Example 4.

Figure 12:
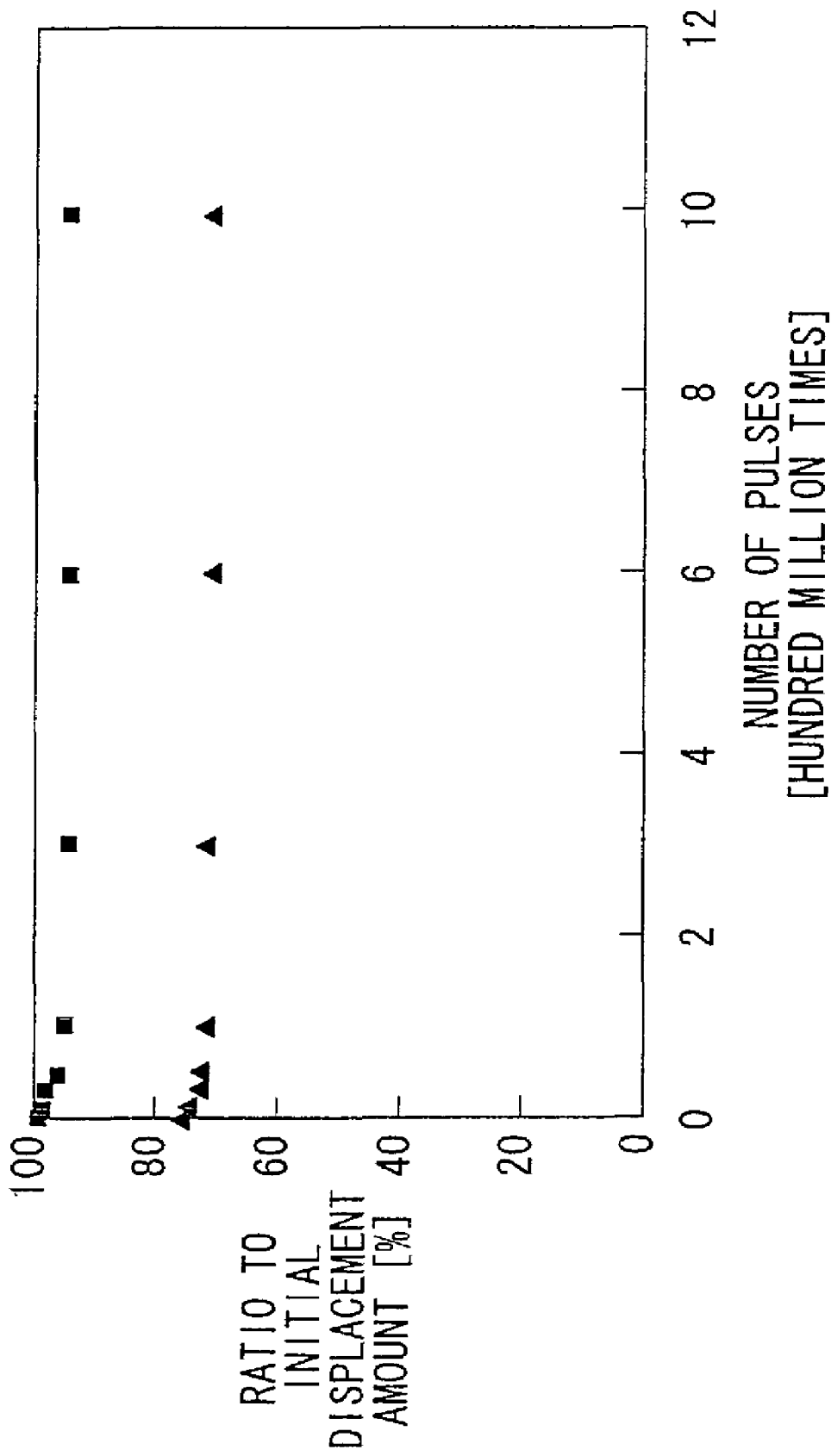
FIG. 12 shows a result obtained in a fifth exemplary experiment (Example 4)

A ceramic device concerning Example 4 was constructed in approximately the same manner as in the Comparative Example described above. However, the former was different from the latter in that lead zirconate titanate (average particle diameter was 0.2 µm) was added in an amount of 1.0% by weight to Pt in the constitutive material of the lower electrode 26b. The result of the fifth exemplary experiment is shown in FIG. 12. In FIG. 12, the results of Case 2 are plotted using solid squares, and the results of Case 3 are plotted using solid triangles.

According to the results described above, all of the initial displacement amounts in Examples 1 to 4 were about 100% in Case 2. However, all of the initial displacement amounts were about 75% in Case 3. According to this fact, it is appreciated that the initial displacement amount is lower as the layer formed on the actuator element 14 has the larger thickness and suppresses the displacement action more greatly.

When the displacement amount is compared after applying the pulses one hundred million times, the following results are obtained. As for Examples 1 to 4, the displacement amount is about 95% in both of Examples 1 and 2 in Case 2, the displacement amount is about 98% in Example 3, and the displacement amount is about 94% in Example 4, in which the displacement amount is scarcely changed. The results obtained in Examples 1 to 4 are greatly different from the result in Comparative Example in which the displacement amount is lowered by about 20%.

As for Case 3, the displacement amount is lowered to about 72% in all of Examples. However, the degree of the change from the initial displacement amount is approximately 3% in all of Examples, showing that the displacement amount is scarcely changed. Further, the displacement amount which was obtained after applying the pulses one billion (1,000,000,000) times is scarcely changed.

In other words, it is appreciated that in Examples 1 to 4 the displacement amount is scarcely decreased and the approximately constant displacement amount is maintained irrelevant to the application time of the pulse voltage even though the layer is formed on the actuator element 14.

As described above, when the additive is added to the electrode material, the decrease in displacement amount of the actuator element 14 is improved. A great improvement is obtained even when the extremely small amount of the additive is added, probably for the following reason. When the vibrating section 20, the electrode (lower electrode 26b in this case) contacting the vibrating section 20, and the shape-retaining layer 24 are integrally fired into one piece, it is considered that the joining performance between the shape-retaining layer 24 and the lower electrode 26b more attributes to the improvement in the decrease in displacement amount (in the presence of an object to suppress the displacement) as compared with the joining performance between the lower electrode 26b and the actuator substrate 12. Further, the joining performance between the shape-retaining layer 24 and the lower electrode 26b more attributes to the improvement in the decrease in displacement amount (in the presence of any one to suppress the displacement) as compared with the joining performance between the shape-retaining layer 24 and the actuator substrate 12.

Further, it is considered that the firing stress generated during the firing is changed by adding the additive to the electrode material.

As for this feature, when the vibrating section 20, the lower electrode 26b contacting the vibrating section 20, and the shape-retaining layer 24 are integrally fired, the shape-retaining layer 24 is integrated on the actuator substrate 12 without using any adhesive or the like. In this process, the shape-retaining layer 24 is fired and shrunk, and thus in the shape-retaining layer 24, internal stress is generated in the vicinity of the joining surface.

If the coating or the like made of resin is formed on the surface of the actuator element 14 in such a state (state in which the stress exists at the joining surface of the shape-retaining layer 24), the balance of the internal stress of the shape-retaining layer 24 may be changed. If the electric power is continuously applied in this state, polarization state may be progressively changed, resulting in the decrease in displacement amount.

In contrast, when the additive is added to the electrode material, the piezoelectric/electrostrictive member of the shape-retaining layer 24, e.g., shrinks in a different manner during the firing when the shape-retaining layer 24 is integrally fired. As a result, the internal stress after the firing of the shape-retaining layer 24 is changed. Therefore, even when the coating is formed on the surface of the actuator element 14, and the electric power is continuously applied in driving, then the polarization state is changed scarcely, and the decrease in displacement amount is suppressed.

Next, the sixth exemplary experiment was directed to the minute amount of the additive (zirconium oxide in this case) and Pt as a constitutive material of the lower electrode 26b, for example, in the ceramic device concerning Example 1. The amount of zirconium oxide (average particle diameter was 0.05 μm) to be added to Pt was changed to observe the fluctuation of the displacement amount when the pulse driving was performed four billion times. The experiment was performed in the condition of Case 2.

Figure 13:
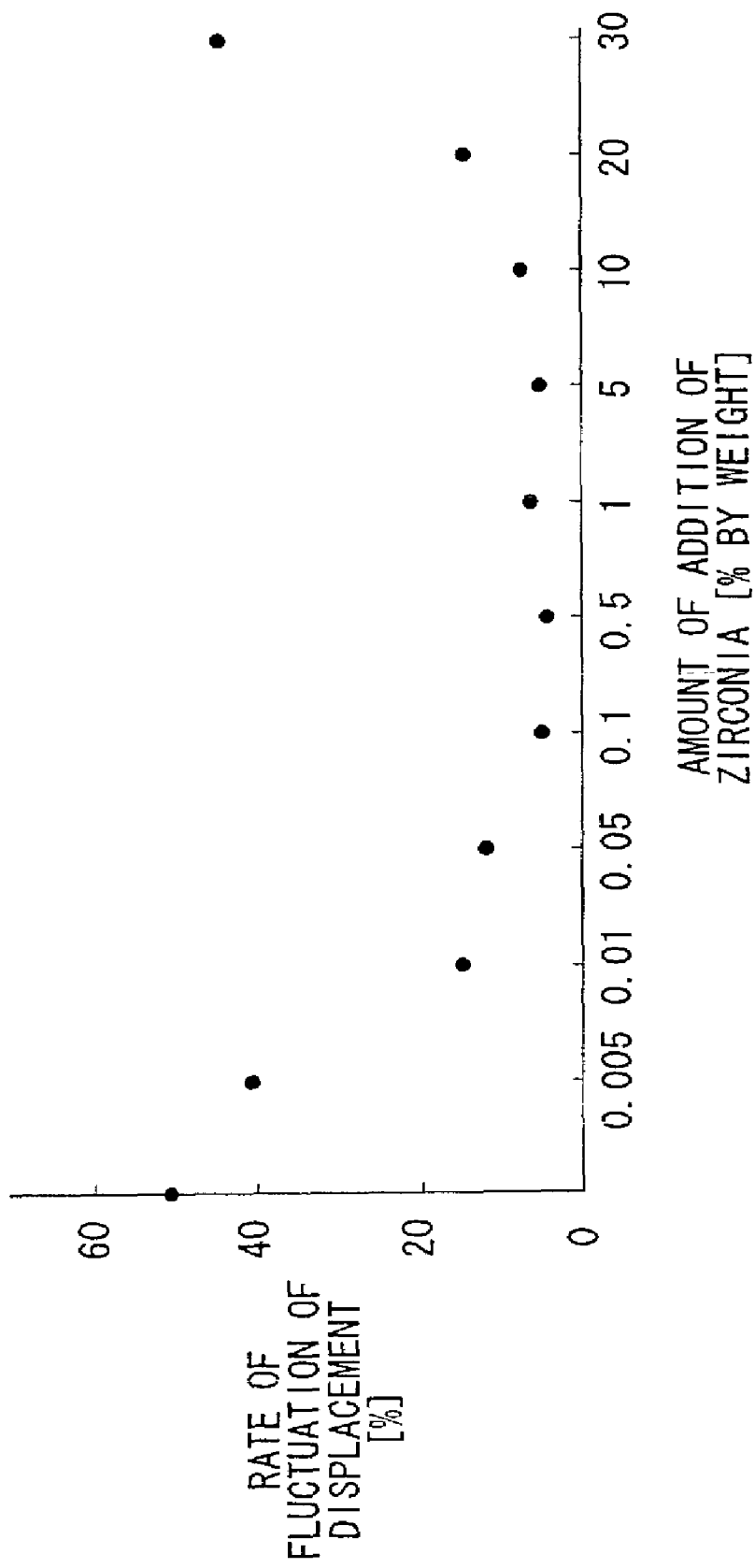
FIG. 13 shows a result obtained in a sixth exemplary experiment.

The experimental result is shown in FIG. 13. According to FIG. 13, when the amount of zirconium oxide to be added to Pt is 0.01% by weight to 20% by weight, the rate of displacement fluctuation is about 15%. Especially, when the amount of zirconium oxide is 0.1% by weight to 10.0% by weight, the rate of displacement fluctuation is about 7%.

Figure 14:
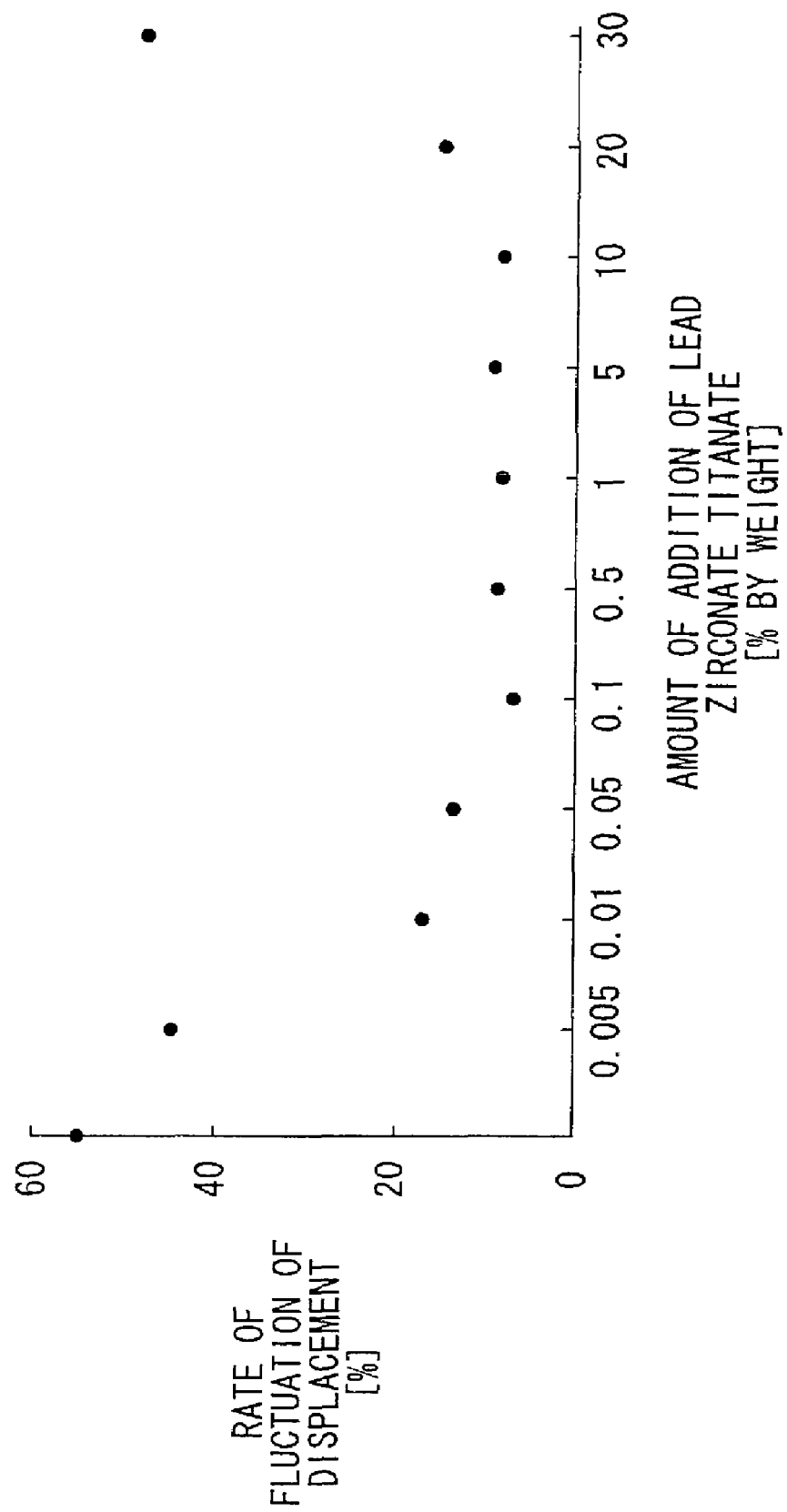
FIG. 14 shows a result obtained in a seventh exemplary experiment.

Next, the seventh exemplary experiment was performed in approximately the same manner as in the sixth exemplary experiment. However, the former was different from the latter in that the additive to Pt was lead zirconate titanate (average particle diameter was 0.5 μm). The experimental result is shown in FIG. 14. According to FIG. 14, when the amount of lead zirconate titanate to be added to Pt is 0.01% by weight to 20% by weight, the rate of displacement fluctuation is about 17%. Especially, when the amount of lead zirconate titanate is 0.1% by weight to 10.0% by weight, the rate of displacement fluctuation is about 10%.

Figure 15:
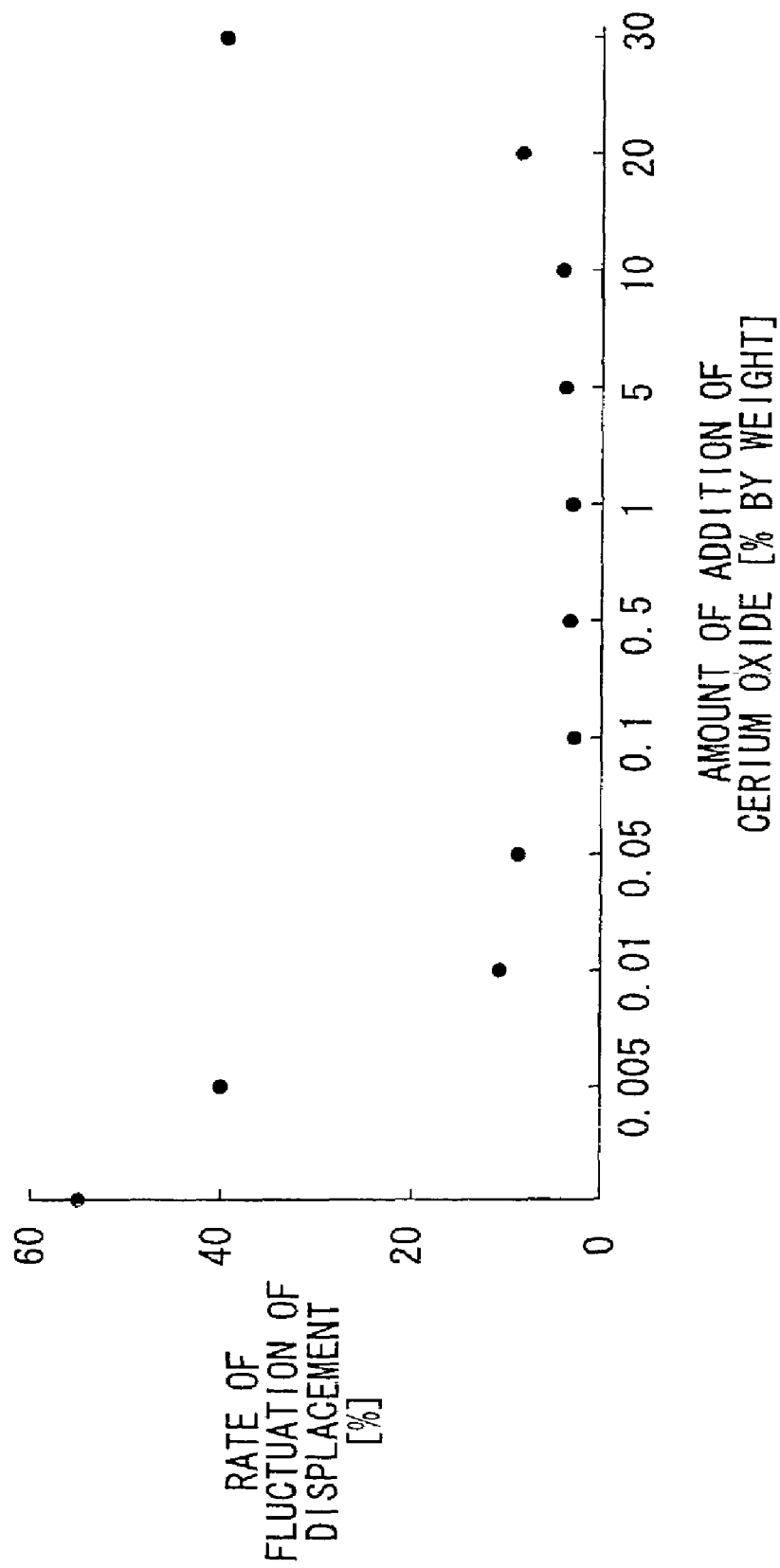
FIG. 15 shows a result obtained in an eighth exemplary experiment.

Next, the eighth exemplary experiment was different in that the additive to Pt was cerium oxide (average particle diameter was 0.05 μm). The experimental result is shown in FIG. 15. According to FIG. 15, when the amount of cerium oxide to be added to Pt is 0.01% by weight to 20% by weight, the rate of displacement fluctuation is about 10%. Especially, when the amount of cerium oxide is 0.1% by weight to 10.0% by weight, the rate of displacement fluctuation is about 4%.

Figure 16:
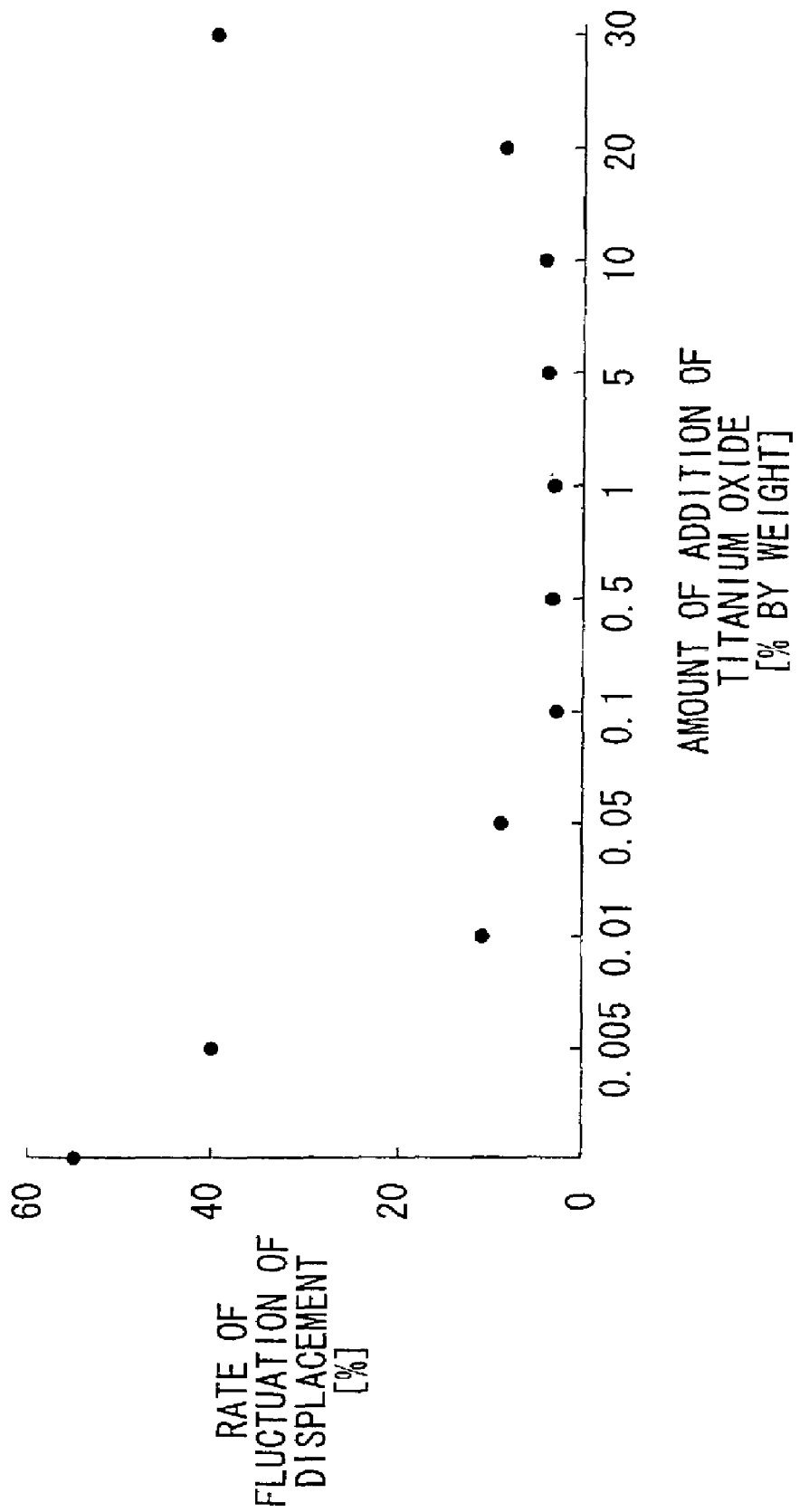
FIG. 16 shows a result obtained in a ninth exemplary experiment.

Next, the ninth exemplary experiment was different in that the additive to Pt was titanium oxide (average particle diameter was 1.5 μm). The experimental result is shown in FIG. 16. According to FIG. 16, when the amount of titanium oxide to be added to Pt is 0.01% by weight to 20% by weight, the rate of displacement fluctuation is about 10%. Especially, when the amount of titanium oxide is 0.1% by weight to 10.0% by weight, the rate of displacement fluctuation is about 4%.

As described above, in the ceramic device 10 according to the embodiment of the present invention, the material of the electrode (lower electrode 26b, the pair of electrodes 26a, 26b) contacting the vibrating section 20 in the pair of electrodes 26a, 26b of the actuator element 14 contains the minute amount of the additive. Therefore, it is possible to reduce the decrease in displacement amount (deterioration of the displacement) of the actuator element 14 even if the coating made of resin is applied to the surface of the actuator element 14. It is possible to avoid decrease in the displacement amount compared to the displacement amount obtained when only the actuator element was operated.

Therefore, in the embodiment of the present invention, even when the displacement-transmitting member 30 is placed or formed on the actuator element 14, it is possible to suppress the decrease in displacement amount caused by the pulse voltage applied to the actuator element 14 for a long time. The displacement amount can be precisely controlled even when the device is driven for a long period of time.

The ceramic device according to the present invention is not limited to the embodiments described above, which may be embodied in other various forms without deviating from the gist or essential characteristics of the present invention.

As explained above, according to the ceramic device concerning the present invention, it is possible to suppress the decrease in displacement amount caused by the pulse voltage applied to the operating section for a long time, even when the displacement-transmitting member is placed or formed on the operating section. It is also possible to control the displacement amount precisely even when the ceramic device is driven for a long period of time.

What is claimed is:

1. A ceramic device comprising:
    an operating section having at least a pair of electrodes formed on a shape-retaining layer, said shape-retaining layer comprising one of a piezoelectric/electrostrictive layer and an anti-ferroelectric layer;
    a vibrating section comprising a ceramic supporting said operating section, at least one electrode of said electrodes contacting said vibrating section; and
    a fixed section comprising a ceramic vibratingly supporting said vibrating section;
    wherein said vibrating section, said electrode contacting said vibrating section, and said shape-retaining layer are integrally fired; and
    wherein at least said electrode contacting said vibrating section comprises an electrode material containing a minute amount of an additive having an average particle diameter of 0.01 to 1.0 μm when said additive is at least one material selected from the group consisting of zirconium oxide, cerium oxide, and hafnium oxide;
    wherein said additive has an average particle diameter of 0.1 to 10.0 μm when said additive is at least one material selected from the group consisting of titanium oxide, the material of the piezoelectric/electrostrictive layer, and the material of the anti-ferroelectric layer; and
    wherein said additive is contained in said electrode material in an amount of 0.1 wt % to 5 wt %.

2. The ceramic device according to claim 1, wherein said ceramic material is at least one material selected from the group consisting of zirconium oxide, cerium oxide, and titanium oxide.

3. The ceramic device according to claim 1, wherein said pair of electrodes includes an upper electrode formed on an upper portion of said shape-retaining layer and a lower electrode formed between said shape-retaining layer and said vibrating section.

4. The ceramic device according to claim 3, wherein said electrode material of said lower electrode contains said minute amount of said additive.

5. The ceramic device according to claim 1, wherein said pair of electrodes contact said vibrating section.

6. The ceramic device according to claim 1, wherein at least said electrode contacting said vibrating section comprises said electrode material containing an element of the platinum group, an alloy of said element of the platinum group and gold and/or silver, an alloy of elements of the platinum group, or an alloy of said alloy of said element of the platinum group and gold and/or silver.

7. The ceramic device according to claim 6, wherein said electrode material contains platinum as a major component.

8. The ceramic device according to claim 1, wherein an object restricting a displacement action of said operating section is formed on said operating section.

* * * * *